US006400206B2

(12) United States Patent
Kim et al.

(10) Patent No.: US 6,400,206 B2
(45) Date of Patent: Jun. 4, 2002

(54) DUAL-LEVEL VOLTAGE SHIFTERS FOR LOW LEAKAGE POWER

(75) Inventors: Hyungwon Kim, Ann Arbor, MI (US); Yibin Ye, Portland, OR (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 09/779,909

(22) Filed: Feb. 8, 2001

Related U.S. Application Data

(62) Division of application No. 09/354,484, filed on Jul. 16, 1999, now abandoned.

(51) Int. Cl.[7] ................................................. H03L 5/00
(52) U.S. Cl. ................... 327/333; 327/208; 327/219; 326/81; 326/68
(58) Field of Search ............................. 326/68, 81, 57; 327/215, 219, 208, 333, 202, 203, 210, 211, 212–214, 218, 225

(56) References Cited

U.S. PATENT DOCUMENTS

| | | | |
|---|---|---|---|
| 4,996,453 A | | 2/1991 | Zanders et al. ............. 307/475 |
| 5,382,838 A | | 1/1995 | Sasaki et al. ............... 327/108 |
| 5,508,648 A | * | 4/1996 | Banik ......................... 327/203 |
| 5,751,174 A | * | 5/1998 | Kuo et al. ................... 327/199 |
| 5,767,716 A | * | 6/1998 | Ko .............................. 327/203 |
| 5,872,476 A | | 2/1999 | Mihara et al. .............. 327/333 |
| 5,880,617 A | | 3/1999 | Tanaka et al. .............. 327/333 |
| 5,929,687 A | * | 7/1999 | Yamauchi ................... 327/333 |
| 5,929,688 A | * | 7/1999 | Ueno et al. ................. 327/333 |
| 6,211,713 B1 | * | 4/2001 | Uhlmann .................... 327/211 |
| 6,225,846 B1 | * | 5/2001 | Wada et al. ................ 327/215 |

OTHER PUBLICATIONS

Kawaguchi, H., et al., "A CMOS Scheme for 0.5V Supply Voltage with Pico–Ampere Standby Current", *ISSCC, IEEE 1998*, Slide Supplement, 154–155, 12.4–1–12.4–4, (1998).
Kuroda, T., et al., "A 0.9–V, 150–MHz, 10–mW, 4 mm2, 2–D Discrete Cosine Transform Core Processor with Variable Threshold–Voltage (VT) Scheme", *IEEE Journal of Solid–State Circuits*, vol. 31, 1770–1779, (Nov. 1996).
Usami, K., et al., "Automated Low–Power Technique Exploiting Multiple Supply Voltages Applied to a Media Processor", *IEEE Journal of Solid–State Circuits*, vol. 33, 463–471, (Mar. 1998).

* cited by examiner

*Primary Examiner*—Terry D. Cunningham
*Assistant Examiner*—Long Nguyen
(74) *Attorney, Agent, or Firm*—Schwegman, Lundberg, Woessner & Kluth, P.A.

(57) ABSTRACT

A dual level voltage shifter includes several series connections of transistors, and cross coupled pairs of transistors, to provide dual-level voltage shifting with low power consumption and low static current. In another embodiment, a dual level voltage shifter includes an inverter with current limiting diodes, and cross coupled inverters with a pass gate in their feedback loop, also providing low power consumption and low static current.

28 Claims, 4 Drawing Sheets

DUAL-LEVEL VOLTAGE SHIFTERS FOR LOW LEAKAGE POWER

This application is a divisional of U.S. Ser. No. 09/354,484, filed Jul. 16, 1999, abn.

FIELD

The present invention relates generally to voltage shifters, and more specifically to dual-level voltage shifters.

BACKGROUND

One of the most challenging problems confronting the designer in deep submicron circuits in today's technological society is leakage power which has increasingly become accountable for a significant portion of the total power consumption of such devices. Recent circuit techniques to reduce the leakage power in circuits have employed higher supply voltage to the circuit in an attempt to drive a leakage control device. One common type of leakage reduction technique comprises a sleep transistor whose gate node is driven by the additional supply voltages. A second type of leakage reduction technique changes the application circuit's body bias using the additional supply voltages. To switch between the standby and active modes, the sleep transistor's gate bias in the case of the first type of leakage reduction or the body bias of the circuit in the case of the second type of leakage reduction need to be switched between different voltage levels. This is accomplished through the use of a voltage shifter. Traditional voltage shifters, however, typically flow a significant amount of static current or support only single level voltage shifting.

For example, FIG. 1 shows a voltage shifter 100 with static current flowing. Voltage shifter 100 comprises a series connection of p-type transistor 102 and n-type transistor 104 in series between voltage $V_{cc}$ and ground. The gates of transistors 102 and 104 are connected to each other. Transistors 106 and 108 are connected in series between $V_{pp}$ and $V_{nn}$, where $V_{pp}=V_{cc}+\Delta V$ and $V_{nn}=-\Delta V$. The gates of transistors 106 and 108 connected to each other and to a node 110 between transistors 102 and 104. An input voltage $V_{in}$ is supplied to the gates of transistors 102 and 104, and an output is generated from between transistors 106 and 108. $V_{in}$ varies from a logical one ($V_{cc}$) to a logical zero (0V). $V_{out}$ varies from $V_{cc}+\Delta V$ to $V_{cc}-\Delta V$.

When $V_{in}$ is set to $V_{cc}$ transistor 104 is on and transistor 102 is off, but the ground voltage at node 110 is insufficient to completely shut off transistor 106, and a static current flows in path 112. When $V_{in}$ is set to 0V, transistor 104 is off and transistor 102 is on, but the voltage $V_{cc}$ at node 110 is insufficient to completely shut off transistor 108, and a static current flows in path 114. Shifter 100 cannot be used for low power circuits.

Another example of a prior art voltage shifter 200 is shown in FIG. 2. Voltage shifter 200 comprises p-type transistor 202 and n-type transistor 204 connected in series between voltage $V_{pp}$ and $V_{nn}$, which is ground, and p-type transistor 206 and n-type transistor 208 also connected in series between $V_{pp}$ and $V_{nn}$ (ground). An input voltage $V_{in}$ is connected to the gate of transistor 204, and through inverter 210 to the gate of transistor 208. The gate of transistor 202 is connected at an output node defined between transistors 206 and 208. The gate of transistor 206 is connected between transistors 202 and 204.

In this configuration, when $V_{in}$ is equal to $V_{cc}$, transistors 204 and 206 are on, and transistors 202 and 208 are off, and $V_{out}$ is pulled to $V_{pp}$, which equals $V_{cc}+\Delta V$, through transistor 206. When $V_{in}$ is set to 0V, transistors 202 and 208 turn on, and transistors 204 and 206 turn off. In this instance, $V_{out}$ is pulled to $V_{nn}$ (ground) through transistor 208. In this single level voltage shifter, no static current flows. However, the circuit 200 is only a single level voltage shifter. If $V_{nn}$ is set to $-\Delta V$ to achieve dual-level voltage shifting, transistors 204 and 208 cannot be fully shut off and static current will flow. Shifter 200 cannot be used for leakage reduction.

For the reasons stated above, and for other reasons stated below which will become apparent to those skilled in the art upon reading and understanding the resent specification, there is a need in the art for a dual-level voltage shifter with no static current flow, and which is capable of use with low power circuits.

SUMMARY

In some embodiments, the invention includes first and second transistors connected in series, and third and fourth transistors connected in series, each series connection between a first potential and a second potential. The gates of the first and third transistors are connected to complementary inputs. Fifth and sixth transistors are also connected in series, and seventh and eighth transistors are also connected in series, each series connection between a third potential and the second potential. The gates of the fourth and sixth transistors are connected to a first node between the first and second transistors, and the gates of the second and eighth transistors are connected to a second node between the third and fourth transistors.

In other embodiments, a level shifter includes a first transistor configured as a diode, a first CMOS inverter, and a second transistor configured as a diode, the first transistor, first inverter, and second transistor connected in series between a first voltage connection and a second voltage connection. Further, a second inverter and a third inverter are connected in parallel between a third voltage connection and a fourth voltage connection. The second and the third inverters are cross coupled, and the output of the first inverter and the input of the second inverter are operatively coupled together. A pass gate is in the feedback loop between the second and the third inverters.

Other embodiments are described and claimed.

DESCRIPTION OF EMBODIMENTS

In the following detailed description of the embodiments, reference is made to the accompanying drawings which form a part hereof, and in which is shown by way of illustration specific embodiments in which the invention may be practiced. It is to be understood that other embodiments may be utilized and structural changes may be made without departing from the scope of the present invention.

Figure 1:
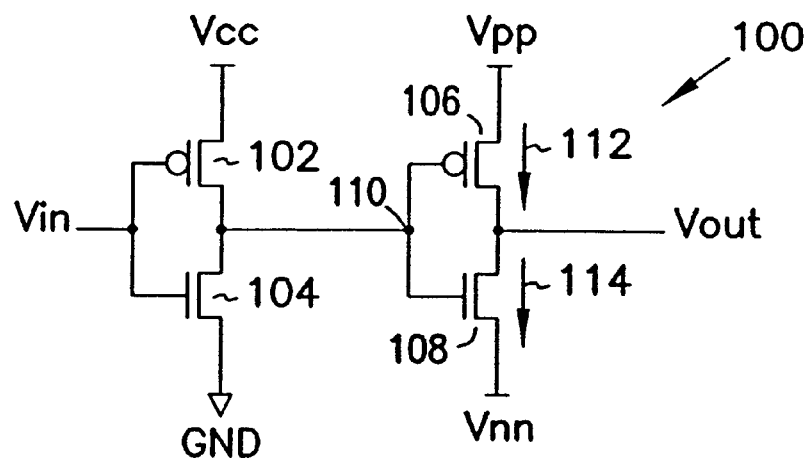
FIG. 1 is a circuit diagram of a prior art voltage shifter.
Figure 2:
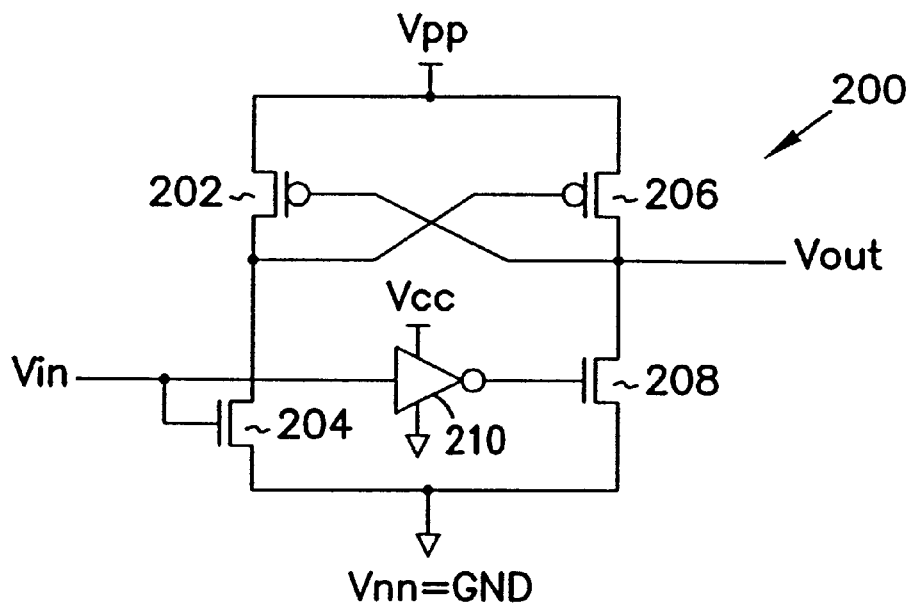
FIG. 2 is a circuit diagram of a second prior art voltage shifter.
Figure 3:
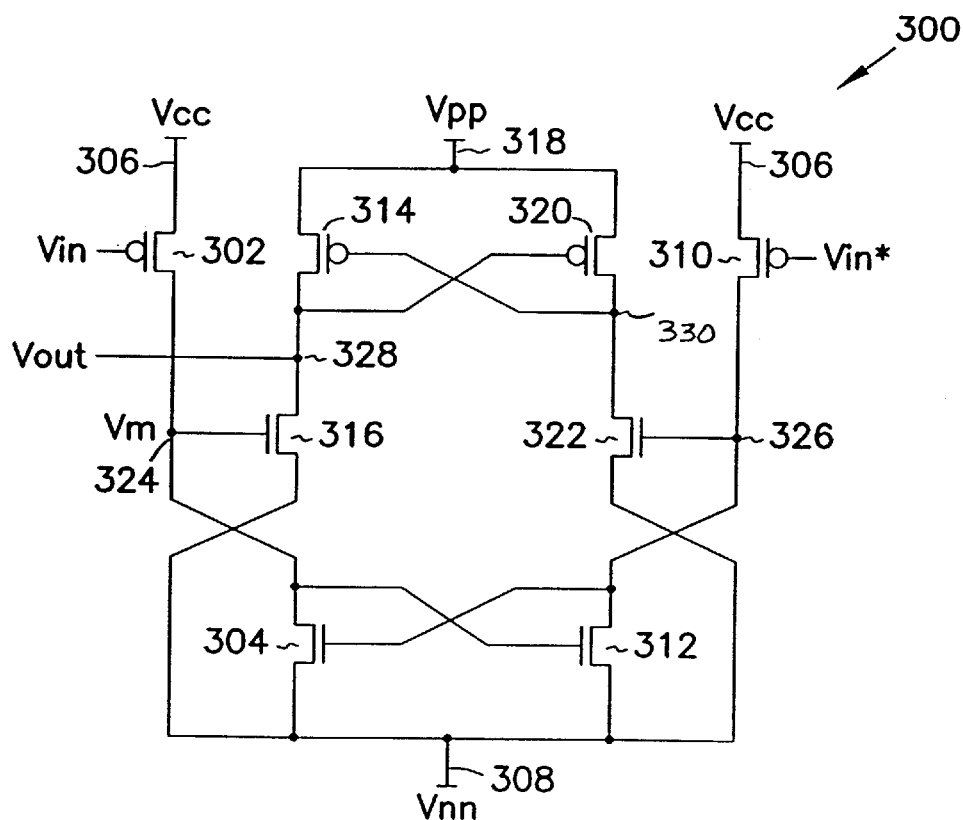
FIG. 3 is a circuit diagram of an embodiment of the present invention.

FIG. 3 shows an embodiment of a dual-level voltage shifter 300 of the present invention. Embodiment 300 comprises a first transistor 302 connected in series with a second transistor 304 between a first node 306 which is at a first potential, a second node 308 which is at a second potential, a third transistor 310 and a fourth transistor 312 also connected in series between first node 306 and second node 308, a fifth transistor 314 and a sixth transistor 316 connected in series between a third node 318 at a third potential and the second node 308, and a seventh transistor 320 and an eighth transistor 322 also connected in series between the third node 318 and the second node 308. The gates of first transistor 302 and third transistor 310 are coupled to complementary inputs $V_{in}$ and $V_{in}*$.

A node 324 is defined at the connection of first transistor 302 and second transistor 304. Node 324 is coupled to the gates of fourth transistor 312 and sixth transistor 316. Another node 326 is defined at the connection of third transistor 310 and fourth transistor 312. Node 326 is coupled to the gates of second transistor 304 and eighth transistor 322. The gate of fifth transistor 314 is coupled to the connection between seventh transistor 320 and eighth transistor 322. The gate of seventh transistor 320 is coupled to an output node 328 defined at the connection between fifth transistor 314 and sixth transistor 316.

Transistors 302, 310, 314, and 320 are in one embodiment p-type transistor switches which are closed (on) between their source and drain when their gate is at a low potential, and which are open (off) between their source and drain when their gate is at a high potential. Transistors 304, 312, 316, and 322 are in one embodiment n-type transistors transistor switches which are closed (on) between their source and drain when their gate is at a high potential, and which are open (off) between their source and drain when their gate is at a low potential. The input potential $V_{in}$ varies from a logical one ($V_{cc}$) to a logical zero (0V). Its complement $V_{in}*$ varies from a logical zero (0V) to a logical one ($V_{cc}$). In the dual-level voltage shifter embodiment 300, first node 306 is at a supply voltage $V_{cc}$, second node 308 is at $V_{nn}=-\Delta V$, and third node 318 is at $V_{pp}=V_{cc}+\Delta V$.

In operation, embodiment 300 functions as follows. When $V_{in}$ is a logical zero (0V), transistor 302 turns on, pulling the potential at node 324 to $V_{cc}$, turning on transistors 312 and 316. Output node 328 is pulled to $V_{nn}$ through transistor 316. On the transition of $V_{in}$ to $V_{cc}$, transistor 302 turns off, and transistor 310 turns on. Node 326 is pulled to $V_{cc}$ through transistor 310, turning transistors 304 and 322 on. Node 324 is pulled to $V_{nn}$ through transistor 304. Node 330 is pulled to $V_{nn}$ through transistor 322, and transistor 314 turns on, pulling output node 328 to $V_{pp}$. The transitions of node 324 and output node 328 are fast due to the cross coupled feedback connections between transistors 314 and 320 or 304 and 312.

Since at least one device in every potential static current path of embodiment 300 is completely shut off, there is no static current flow in embodiment 300. The voltage shifting accomplished by embodiment 300 is dual-level, with output node 328 voltage shifting between $V_{pp}$ and $V_{nn}$. The voltages $V_{pp}$ and $V_{nn}$ can be set to virtually any voltages. In one embodiment, $V_{pp}=V_{cc}+\Delta V$ and $V_{nn}=-\Delta V$.

Figure 4:
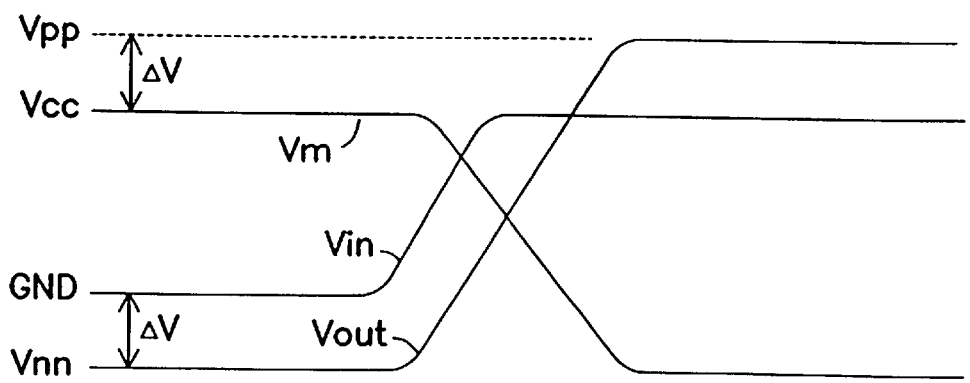
FIG. 4 is a diagram showing operation of the embodiment of FIG. 3.

A partial timing diagram showing the operation of embodiment 300 is shown in FIG. 4. As $V_{in}$ rises from ground (logical zero) to $V_{cc}$ (logical one), the voltage at node 328 rises from $V_{nn}$ to $V_{pp}$, and the voltage at node 324 drops from $V_{cc}$ to $V_{nn}$.

Figure 5:
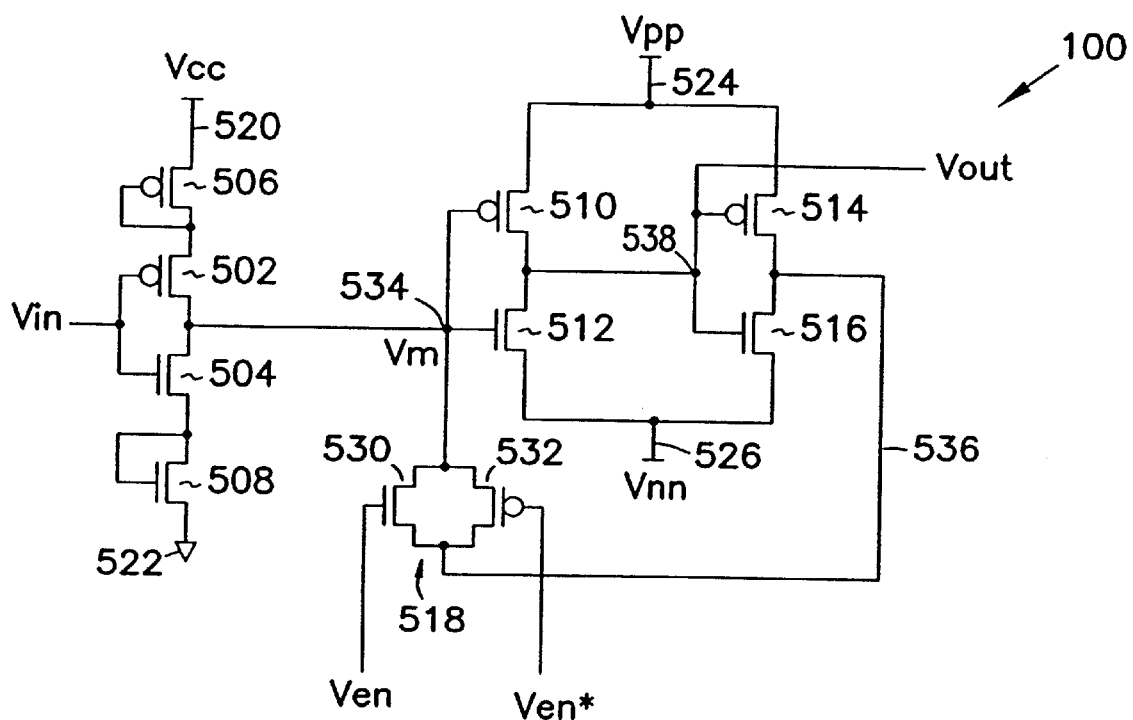
FIG. 5 is a circuit diagram of an alternative embodiment of the present invention.

FIG. 5 shows another embodiment 500 of a dual-level voltage shifter. Embodiment 500 comprises a first branch comprising first transistor 502 and second transistor 504 connected in series between third transistor 506 and fourth transistor 508, a second branch comprising a fifth transistor 510 and a sixth transistor 512 connected in series and a seventh transistor 514 and an eighth transistor 516 connected in series, and a pass gate 518.

Transistors 506 and 508 are connected as current limiting diodes, transistor 506 having its gate connected between transistor 506 and transistor 502, and transistor 508 having its gate connected between transistor 508 and transistor 504. The series connection of transistors 506, 502, 504, and 508 is connected between a first node 520 at a first potential, and a second node 522 at a second potential. In one embodiment, node 520 is at $V_{cc}$ (logic one) and node 522 is at ground (logic zero). The series connections of transistors 510 and 512, and 514 and 516, are connected in parallel between a third node 524 which is at a third potential, and a fourth node 526 which is at a fourth potential. In one embodiment, node 524 is at $V_{pp}=V_{cc}+\Delta V$, and node 526 is at $-\Delta V$.

Pass gate 518 comprises two transistors 530 and 532 connected in parallel. As shown in FIG. 5, transistor 530 is an n-type transistor and transistor 532 is a p-type transistor. The gates of the transistors 530 and 532 are connected to complementary inputs $V_{en}$ and $V_{en}*$, respectively.

Pass gate 518 is connected between node 534 and node 536. Node 534 is also connected to the gates of transistors 510 and 512, and between transistors 502 and 504. Node 536 is connected between transistors 514 and 516. An output node 538 is defined between transistors 510 and 512, and is also connected to the gates of transistors 514 and 516.

Transistors 510 and 512 form a first inverter, and transistors 514 and 516 form a second inverter. The first and second inverters are cross coupled, and pass gate 518 is in the feedback loop. Transistors 502 and 504 form an inverter, and transistors 506 and 508 act as current limiting diodes. The pass gate 518 substantially instantaneously disconnects the feedback loop of the cross coupled inverters to avoid large current involved to flip the cross coupled inverters'state.

Figure 6:
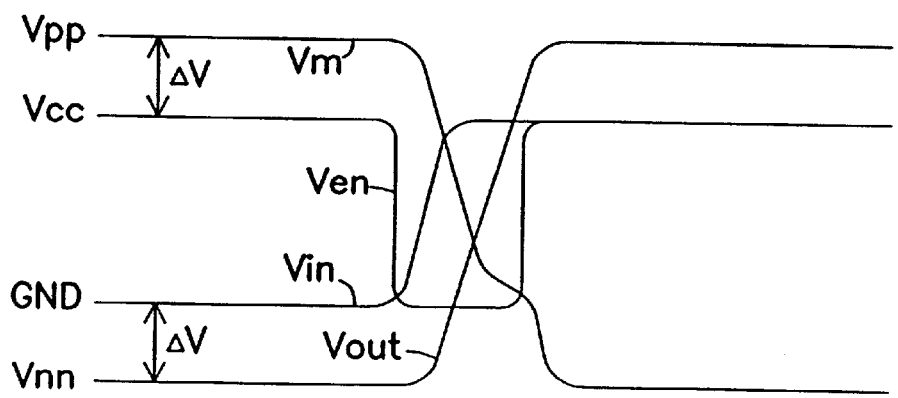
FIG. 6 is a diagram showing operation of the embodiment of FIG. 5.

The operation of the embodiment 500 is shown in greater detail in FIG. 6. Pass gate 518 is always on when the potential $V_{en}$ is at logic one. When voltage shifting occurs, pass gate 518 disconnects the feedback loop to avoid the large current involved in flipping the state of the cross coupled inverters. When $V_{in}$ is logic zero and voltage $V_{en}$=logic one, node 534 is initially pulled to near $V_{cc}$ through transistor 502, with current limited by diode 506, while transistor 504 is turned off. Transistor 510 is turned off and transistor 512 is turned on, and node 538 is pulled to $V_{nn}$ through transistor 512. This in turn turns transistor 514 on and transistor 516 off. Node 536 is pulled to $V_{pp}$ through transistor 514. The pass gate 518 passes potential $V_{pp}$ to node 534. Output node 538 is held at the potential coupled to node 526.

To shift the voltage level of embodiment 500, $V_{en}$ is set to logic zero, and $V_{in}$ is raised to logic one ($V_{cc}$). When this occurs, transistor 502 shuts off and transistor 504 turns on. The voltage at node 534 is pulled to $V_{th}$ above ground through transistor 504, with current limited by diode 508, and transistor 508 begins to enter its cutoff region. As the potential at node 534 decreases, output voltage at output node 538 approaches $V_{pp}$, turning transistor 516 on and turning transistor 514 off. Voltage at node 536 is pulled to $V_{nn}$ through transistor 516. $V_{en}$ is then raised to logic one, connecting the feedback loop through pass gate 518, pulling the potential at node 534 to $V_{in}$. As the potential at node 534 drops, transistor 510 turns on and transistor 512 turns off, pulling output node 538 to $V_{pp}$ through transistor 510.

When $V_{in}$ is lowered to logic zero, transistor 504 shuts off, and transistor 502 turns on. This pulls node 534 to near $V_{cc}$ through transistor 502, with current limited by diode 506. The potential at node 534 turns transistor 510 off and transistor 512 on. Node 538 is pulled to $V_{nn}$ through transistor 512. The potential at node 538 turns transistor 514 on and transistor 516 off, pulling node 536 to $V_{pp}$ through transistor 514. Pass gate 518 passes potential $V_{pp}$ to node 534, and output node 538 is held at $V_{nn}$.

Although transistor 504 can conduct static current from ground potential 522 to $V_{nn}$ due to its forward bias when $V_{in}$ is at logic one, the current is shut off by transistor 508 which is under a reverse bias. Likewise, when $V_{in}$ is lowered to logic zero, static current flow through transistor 502 is shut off by transistor 506.

No static current flows in embodiment 500. Embodiment 500 provides dual-level voltage shifting between $V_{nn}$ and $V_{pp}$ with no static current. The input potentials $V_{en}$ and $V_{en}^*$ coupled to the gates of pass gate transistors 530 and 532, respectively, may be generated from the rising and falling transitions of $V_{in}$.

As supply voltage $V_{cc}$ to the application circuit is lowered to reduce the active power of the circuits, the threshold voltage is lowered as well to maintain the speed of the circuit. The low threshold voltage drastically increases the leakage current up to a significant portion of the total power consumed by the application circuit. Leakage reduction techniques that shut off leakage current of idling blocks or an entire microchip in standby mode are becoming important. These techniques require low power voltage level shifting to switch the voltage level of the supplies. The voltage level shifters of the present invention provide dual-level voltage shifting required by modem components without generating static current. They are therefore well suited to leakage reduction techniques.

Figure 7:
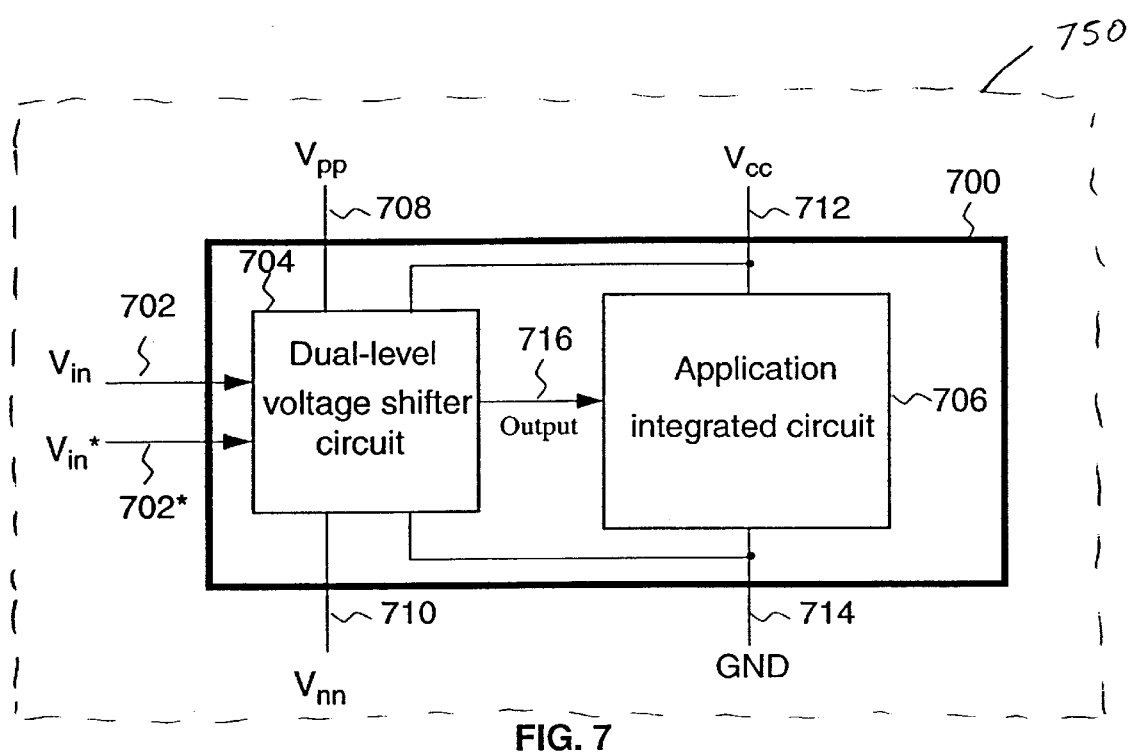
FIG. 7 is a block diagram of an integrated circuit embodiment according to one embodiment of the present invention.

FIG. 7 illustrates a block diagram of an integrated circuit 700 that comprises an embodiment of the present invention dual-level voltage shifter circuit 704 driving an application integrated circuit 706. The circuit 704 receives an input voltage 702 and its complement 702*, and supply voltages 708, connected to $V_{pp}$, and 710, connected to $V_{nn}$. The circuit 704 switches its output 716's voltage level between $V_{pp}$ and $V_{nn}$. The application integrated circuit 706 receives the regular supply voltages 712, connected to $V_{cc}$, and 714, connected to GND, and receives the shifted voltage 716 from the circuit 704. The dual-level voltage shifter circuit 704 can be arranged as described above with respect to FIGS. 3 and 5. The application integrated circuit may be of any type, including but not limited to a processor, memory, memory controller, or application-specific integrated circuit (ASIC).

As shown in FIG. 7, the integrated circuit 700 may be part of a computer system 750. Such a system could include a desktop system, a portable system, or the like.

It is to be understood that the above description is intended to be illustrative, and not restrictive. Many other embodiments will be apparent to those of skill in the art upon reading and understanding the above description. The scope of the invention should, therefore, be determined with reference to the appended claims, along with the full scope of equivalents to which such claims are entitled.

What is claimed is:

1. A dual-level voltage shifter, comprising:
   a first branch comprising first, second, third, and fourth transistors connected in series between a first node and a second node, the first and fourth transistors configured as diodes, and the gates of the second and third transistors connected to each other;
   a second branch comprising fifth and sixth transistors, and a third section comprising seventh and eighth transistors, the second and the third sections each connected in series between a third node and a fourth node;
   a pass gate connected between a node defined between the second and third transistors, and between the seventh and eighth transistors;
   a node defined between the second and third transistors, and connected to the gates of the fifth and sixth transistors; and
   the gates of the seventh and eighth transistors connected to a node defined between the fifth and sixth transistors.

2. The voltage shifter of claim 1, wherein the pass gate comprises two transistors connected in parallel, one p-type transistor and one n-type transistor, the gates of the pass gate transistors connected to complementary inputs.

3. The voltage shifter of claim 1, wherein the first, second, fifth, and seventh transistors are each a p-type transistor.

4. The voltage shifter of claim 1, wherein the third, fourth, sixth, and eighth transistors are each an n-type transistor.

5. The voltage shifter of claim 4, wherein the voltage shifter is in a computer system.

6. A dual-level voltage shifter, comprising:
   a first transistor configured as a diode, a first CMOS inverter, and a second transistor configured as a diode, the first transistor, first inverter, and second transistor connected in series between a first node and a second node;
   a second inverter and a third inverter connected in parallel between a third node and a fourth node, the second and the third inverters cross coupled, the output of the first inverter and the input of the second inverter operatively coupled together; and
   a pass gate in the feedback loop between the second and the third inverters.

7. The voltage shifter of claim 6, wherein the fourth node is coupled to a second output potential and the second voltage connection is coupled to ground, and wherein the second output potential is lower than ground potential.

8. The voltage shifter of claim 6, wherein the pass gate comprises two transistors connected in parallel, one p-type transistor and one n-type transistor, the gates of the pass gate transistors connected to complementary inputs.

9. The voltage shifter of claim 6, wherein the first inverter comprises a pair of transistors, the transistors comprising one p-type transistor and one n-type transistor, the gate of each transistor coupleable to an input voltage.

10. The voltage shifter of claim 6, wherein the second inverter comprises a pair of transistors, the transistors comprising one p-type transistor and one n-type transistor.

11. The voltage shifter of claim 6, wherein the third inverter comprises a pair of transistors, the transistors comprising one p-type transistor and one n-type transistor.

12. The voltage shifter of claim 6, wherein the third node is coupled to an output potential and the first node is coupled to a supply potential, the output potential greater than the supply potential.

13. A computer system, comprising:

a computer with a motherboard having a processor operatively coupled to the motherboard; and the processor having an integrated circuit comprising:
- a first input connection for receiving an input voltage signal; and
- a dual-level voltage shifter circuit coupled to receive the input voltage signal, the voltage shifter circuit comprising:
  - a first transistor configured as a diode, a first CMOS inverter, and a second transistor configured as a diode, the first transistor, first inverter, and second transistor connected in series between a first node and a second node;
  - a second inverter and a third inverter connected in parallel between a third node and a fourth node, the second and the third inverters cross coupled, the output of the first inverter and the input of the second inverter operatively coupled together; and
  - a pass gate in the feedback loop between the second and the third inverters.

14. The computer system of claim 13, wherein the third node is coupled to an output potential and the first node is coupled to a supply potential, the output potential greater than the supply potential.

15. The computer system of claim 13, wherein the fourth node is coupled to a second output potential and the second node is coupled to ground, and wherein the second output potential is lower than ground potential.

16. The computer system of claim 13, wherein the pass gate comprises two transistors connected in parallel, one p-type transistor and one n-type transistor, the gates of the pass gate transistors connected to complementary inputs.

17. The computer system of claim 13, wherein the first inverter comprises a pair of transistors, the transistors comprising one p-type transistor and one n-type transistor, the gate of each transistor coupleable to an input voltage.

18. The computer system of claim 13, wherein the second inverter comprises a pair of transistors, the transistors comprising one p-type transistor and one n-type transistor.

19. The computer system of claim 13, wherein the third inverter comprises a pair of transistors, the transistors comprising one p-type transistor and one n-type transistor.

20. A voltage shifting circuit comprising:
- a first inverter, a first current limiting device, and a second current limiting device, the first inverter coupled to a first upper voltage supply node through the first current limiting device, and coupled to a first lower supply node through the second current limiting device, the first inverter having an output node;
- a pair of cross coupled inverters having an input node coupled to the output node of the first inverter, each inverter of the pair of cross coupled inverters having a positive power supply node coupled to a second upper voltage supply node and a negative power supply node coupled to a second lower voltage supply node; and
- a pass gate coupled between the pair of cross coupled inverters.

21. The voltage shifting circuit of claim 20 wherein the first inverter comprises series connected complementary transistors, and the first current limiting device includes a diode connected transistor.

22. The voltage shifting circuit of claim 20 wherein each inverter of the pair of cross coupled inverters includes a pair of series connected complementary transistors.

23. The voltage shifting circuit of claim 20 wherein the second upper voltage supply node is configured to be at a higher voltage than the first upper voltage supply node, and the first lower voltage supply node is configured to be at a lower voltage than the first lower voltage supply node.

24. The voltage shifting circuit of claim 23 wherein the pass gate comprises a p-channel transistor and an n-channel transistor coupled in parallel.

25. The voltage shifting circuit of claim 24 wherein the first inverter comprises series connected complementary transistors, and the first current limiting device includes a diode connected transistor.

26. A voltage shifting circuit comprising:
- a first inverter;
- a second inverter cross coupled with the first inverter, wherein the first and second inverters each include a positive power supply node coupled to a first upper voltage supply node, and a negative power supply node coupled to a first lower voltage supply node;
- a pass gate coupled between an output node of the second inverter and an input node of the first inverter; and
- a third inverter having a limited current output node coupled to the input node of the first inverter, the third inverter coupled between a second upper voltage supply node and a lower voltage supply node.

27. The voltage shifting circuit of claim 26 wherein the third inverter comprises:
- a first p-channel transistor and a first n-channel transistor coupled in series;
- a second p-channel transistor coupled as a diode between the first p-channel transistor and the second upper voltage supply node; and
- a second n-channel transistor coupled as a diode between the first n-channel transistor and the second lower voltage supply node.

28. The voltage shifting circuit of claim 27 wherein the pass gate includes a control node, responsive to which the pass gate conditionally couples the output node of the second inverter and the input node of the first inverter.

* * * * *

UNITED STATES PATENT AND TRADEMARK OFFICE
CERTIFICATE OF CORRECTION

PATENT NO. : 6,400,206 B2
DATED : June 4, 2002
INVENTOR(S) : Hyungwon Kim and Yibin Ye It is certified that error appears in the above-identified patent and that said Letters Patent is hereby corrected as shown below:

Column 1,
Line 46, insert -- , -- after "$V_{cc}$", therefor

Column 2,
Line 11, delete "resent" and insert -- present --, therefor.

Column 5,
Line 1, delete "$V_{in}$" and insert -- $V_{nn}$ --, therefor.
Line 37, delete "modem" and insert -- modern --, therefor.

Signed and Sealed this

Twenty-sixth Day of November, 2002

*Attest:*

*Attesting Officer*

JAMES E. ROGAN
*Director of the United States Patent and Trademark Office*